(12) United States Patent
Shen et al.

(10) Patent No.: US 10,745,595 B2
(45) Date of Patent: Aug. 18, 2020

(54) RESIN COMPOSITION, ADHESIVE LAYER, AND CIRCUIT BOARD UTILIZING SAME

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Fu-Yun Shen, Huai an (CN); Cong Lei, Huai an (CN); Ming-Jaan Ho, New Taipei (TW); Hsiao-Ting Hsu, New Taipei (TW)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 146 days.

(21) Appl. No.: 16/021,222

(22) Filed: Jun. 28, 2018

(65) Prior Publication Data
US 2019/0330500 A1    Oct. 31, 2019

(30) Foreign Application Priority Data
Apr. 26, 2018    (CN) .......................... 2018 1 0390946

(51) Int. Cl.
| | | |
|---|---|---|
| C09J 109/06 | (2006.01) |
| C08K 3/28 | (2006.01) |
| C08K 3/36 | (2006.01) |
| C08F 210/02 | (2006.01) |
| C08F 212/08 | (2006.01) |
| C08F 236/06 | (2006.01) |
| C08K 5/00 | (2006.01) |

(52) U.S. Cl.
CPC ............... *C09J 109/06* (2013.01); *C08K 3/28* (2013.01); *C08K 3/36* (2013.01); *C08K 5/0066* (2013.01); *C08F 210/02* (2013.01); *C08F 212/08* (2013.01); *C08F 236/06* (2013.01); *C08F 2800/20* (2013.01); *C08K 2003/285* (2013.01)

(58) Field of Classification Search
CPC . C09J 109/06; C08K 3/28; C08K 3/36; C08K 5/0066; C08K 2003/285; C08F 210/02; C08F 212/08; C08F 236/06; C08F 2800/20
USPC ........................................................ 524/147
See application file for complete search history.

(56) References Cited

FOREIGN PATENT DOCUMENTS

| | | | |
|---|---|---|---|
| CN | 107541003 A | | 1/2018 |
| CN | 107641483 A | | 1/2018 |
| TW | 201710363 | * | 3/2017 |
| TW | 201710363 A | | 3/2017 |

* cited by examiner

*Primary Examiner* — William K Cheung
(74) *Attorney, Agent, or Firm* — ScienBiziP, P.C.

(57) ABSTRACT

A resin having thermal conductivity comprises a styrene-butadiene-styrene block copolymer in 35 to 85 parts by weight, a styrene-ethylene-butene-styrene block copolymer in 5 to 65 parts by weight, a polyphenylene ether in 3 to 35 parts by weight; and a dendritic acrylate oligomer in 3 to 45 parts by weight. An adhesive layer and a circuit board using the resin composition are also described.

11 Claims, 8 Drawing Sheets

RESIN COMPOSITION, ADHESIVE LAYER, AND CIRCUIT BOARD UTILIZING SAME

FIELD

The subject matter herein generally relates to a resin composition, an adhesive layer using the resin composition, and a circuit board using the resin composition.

BACKGROUND

In some electronic devices, heat sources like CPUs may be covered by adhesive layers or be in contact with the adhesive layers.

However, thermal conductivity of materials for the adhesive layer can be poor.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
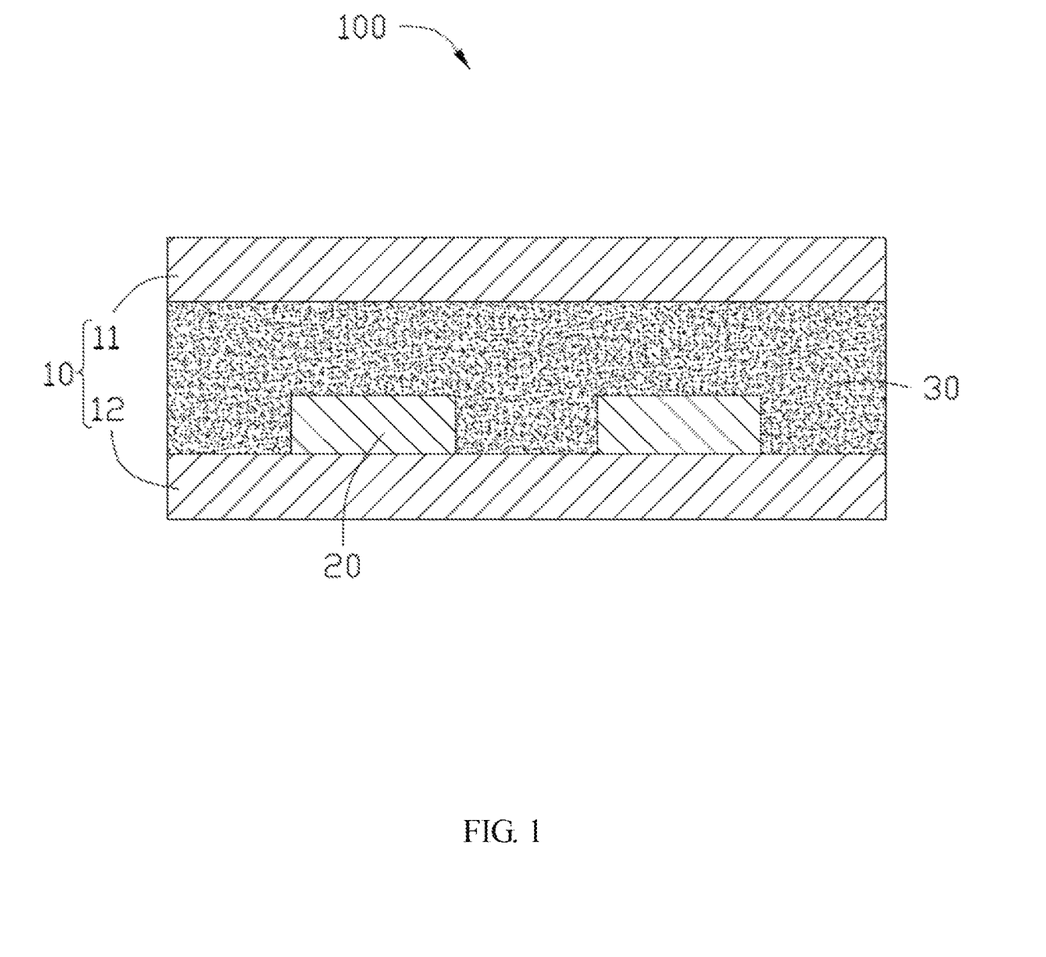
FIG. 1 is a cross-sectional view of an embodiment of a heating equalization plate.

FIG. 1 illustrates an embodiment of a heating equalization plate 100. The heating equalization plate 100 comprises at least one substrate 10 and at least one adhesive layer 30, the at least one adhesive layer 30 is formed on the substrate 10.

In at least one embodiment, each substrate 10 is polyimide. The material and the number of substrates 10 can be varied as needed. In at least one embodiment, the at least one substrate 10 comprise a first substrate 11 and a second substrate 12, the second substrate 12 is spaced from the first substrate 11.

Each adhesive layer 30 is a heat resistable thermoplastic rubber composite material. In at least one embodiment, the heating equalization plate 100 comprises an adhesive layer 30, the adhesive layer 30 is sandwiched between the first substrate 11 and the second substrate 12.

Each adhesive layer 30 is made of a cured resin composition. The resin composition comprises a styrene-butadiene-styrene block copolymer of about 35 to about 85 parts by weight, a styrene-ethylene-butene-styrene block copolymer of about 5 to about 65 parts by weight, a polyphenylene ether of about 3 to about 35 parts by weight, and a dendritic acrylate oligomer of about 3 to about 45 parts by weight.

The resin composition may further comprise a heat-conducting powder of about 5 to about 150 parts by weight. The heat-conducting powder can be selected from a group consisting of silicon dioxide, aluminum trioxide, boron nitride, aluminum nitride, and any combination thereof.

The resin composition may further comprise a flame retardant of about 5 to about 250 parts by weight. The flame retardant may be a phosphate. In at least one embodiment, the flame retardant may be selected from a group consisting of bisphenol diphenyl phosphate, ammonium polyphosphate, hydroquinone bis-(diphenyl phosphate), trimethyl phosphate (TMP), dimethyl methyl phosphonate (DMMP), resoreinol dixylenylphosphate (RDXP), melamine polyphosphate, accidentally phosphorus compounds, phosphazene compound, 9,10-dihydro-9-oxa-10-phosphaphenanthrene-10-oxide (DOPO), and any combination thereof, such as a flame retardant under the trade name "OP935" produced by CLAMANT Corporation.

The resin composition may further comprise an ion trapping agent of about 0.5 to about 10 parts by weight. The ion trapping agent may be selected from a group consisting of aluminum silicate, hydrated metal oxide, polyvalent metal salt, and heteropoly acid. The hydrated metal oxide may be selected from a group consisting of antimony oxide hydrate ($Sb_2O_5 \cdot 2H_2O$), bismuth oxide hydrate ($Bi_2O_3 \cdot nH_2O$), and any combination thereof, such as an ion trapping agent under the trade name "IEX-600" produced by TOAGOSEI CO., LTD. The polyvalent metal salt may be selected from a group consisting of zirconium hydrogen phosphate monohydrate ($Zr(HPO_4)_2 \cdot H_2O$), titanium hydrogen phosphate monohydrate ($Ti(HPO_4)_2 \cdot H_2O$), and any combination thereof. The heteropoly acid may be selected from a group consisting of molybdenum ammonia phosphate hydrate ($(NH_4)_3Mo_{12}(PO_4)_{40} \cdot nH_2O$), hydroxyapatite ($Ca_{10}(PO_4)_6(OH)_2$), aluminum magnesium carbonate hydroxide hydrate ($AlMg(OH)_3CO_3 \cdot nH_2O$), and any combination thereof.

Example 1

The resin composition comprises 35 parts weight of the styrene-butadiene-styrene block copolymer, 60 parts weight of the styrene-ethylene-butene-styrene block copolymer, 10 parts weight of the polyphenylene ether, 40 parts weight of the dendritic acrylate oligomer, 7 parts weight of the heat-conducting powder, 15 parts weight of the flame retardant, and 3 parts weight of the ion trapping agent. The adhesive layer 30 formed by curing the resin composition has a thermal conductivity of about 2.1 W/m·k.

Example 2

The resin composition comprises 35 parts weight of the styrene-butadiene-styrene block copolymer, 60 parts weight of the styrene-ethylene-butene-styrene block copolymer, 10 parts weight of the polyphenylene ether, 40 parts weight of the dendritic acrylate oligomer, 16 parts weight of the heat-conducting powder, 15 parts weight of the flame retardant, and 3 parts weight of the ion trapping agent. The adhesive layer 30 formed by curing the resin composition has a thermal conductivity of about 2.8 W/m·k.

Example 3

The resin composition comprises 55 parts weight of the styrene-butadiene-styrene block copolymer, 40 parts weight of the styrene-ethylene-butene-styrene block copolymer, 20 parts weight of the polyphenylene ether, 30 parts weight of the dendritic acrylate oligomer, 7 parts weight of the heat-conducting powder, 15 parts weight of the flame retardant, and 3 parts weight of the ion trapping agent. The adhesive layer 30 formed by curing the resin composition has a thermal conductivity of about 1.9 W/m·k.

Example 4

The resin composition comprises 55 parts weight of the styrene-butadiene-styrene block copolymer, 40 parts weight of the styrene-ethylene-butene-styrene block copolymer, 20 parts weight of the polyphenylene ether, 30 parts weight of the dendritic acrylate oligomer, 16 parts weight of the heat-conducting powder, 15 parts weight of the flame retardant, and 3 parts weight of the ion trapping agent. The adhesive layer 30 formed by curing the resin composition has a thermal conductivity of about 2.6 W/m·k.

In an embodiment, the heating equalization plate 100 may further comprise at least one electrical conductor 20 formed on a surface of the second substrate 12 and covered by the adhesive layer 30. The electrical conductor 20 is made of a metal, such as copper. The number of electrical conductors 20 can be varied as needed.

Figure 2:
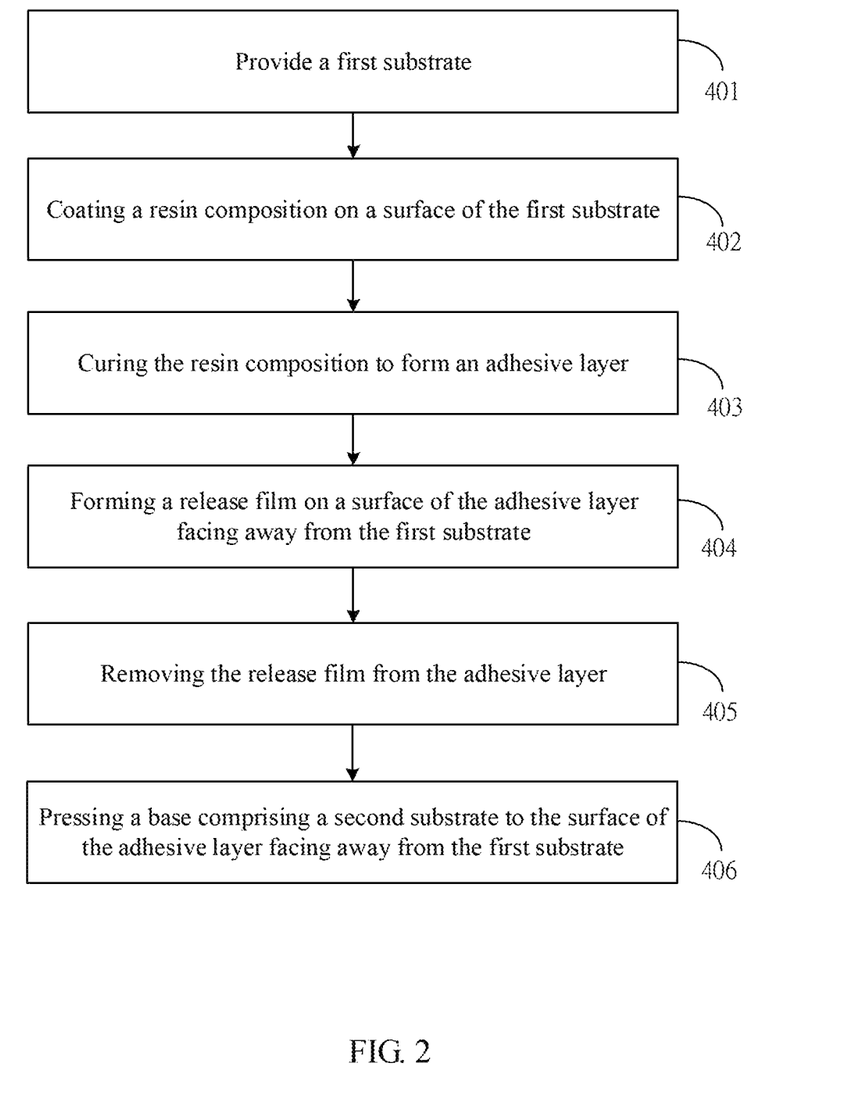
FIG. 2 is a flowchart of an embodiment of a method for manufacturing the heating equalization plate of FIG. 1.

FIG. 2 illustrates a flowchart of a method in an embodiment. The method for manufacturing a heating equalization plate 100 (shown in FIG. 1) is an example only, as there are other ways to carry out the method. Each block shown in FIG. 2 represents one or more processes, methods, or subroutines carried out in the exemplary method. Furthermore, the illustrated order of blocks is by example only and the order of the blocks can be changed. Additional blocks may be added or fewer blocks may be utilized, without departing from this disclosure. The exemplary method can begin at block 401.

Figure 3:
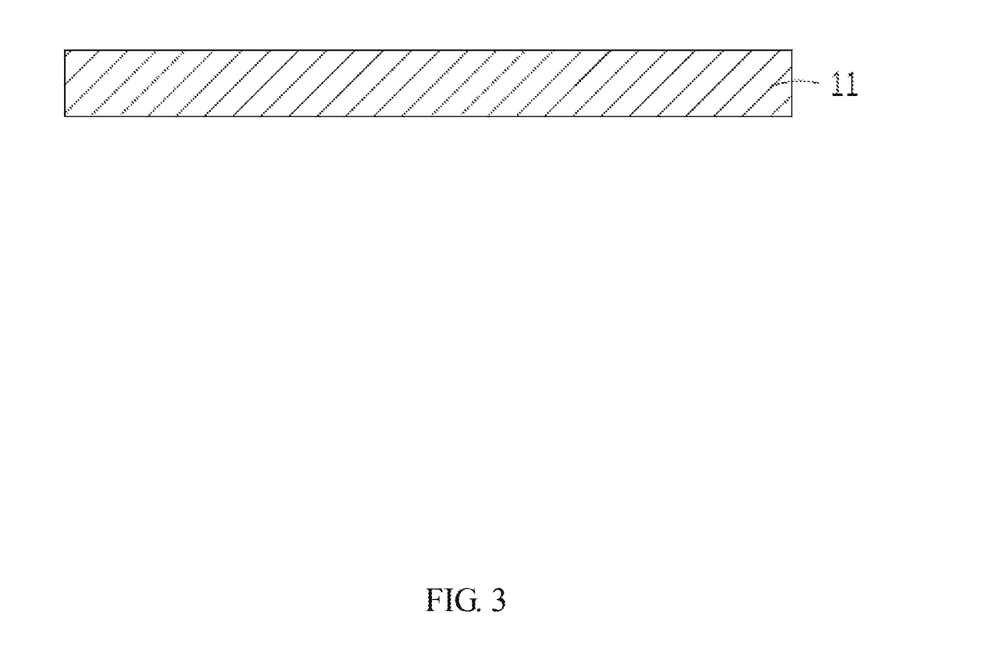
FIG. 3 is a cross-sectional view of a first substrate used in the heating equalization plate of FIG. 1.

At block 401, referring to FIG. 3, a first substrate 11 is provided. The first substrate 11 is made of polyimide.

Figure 4:
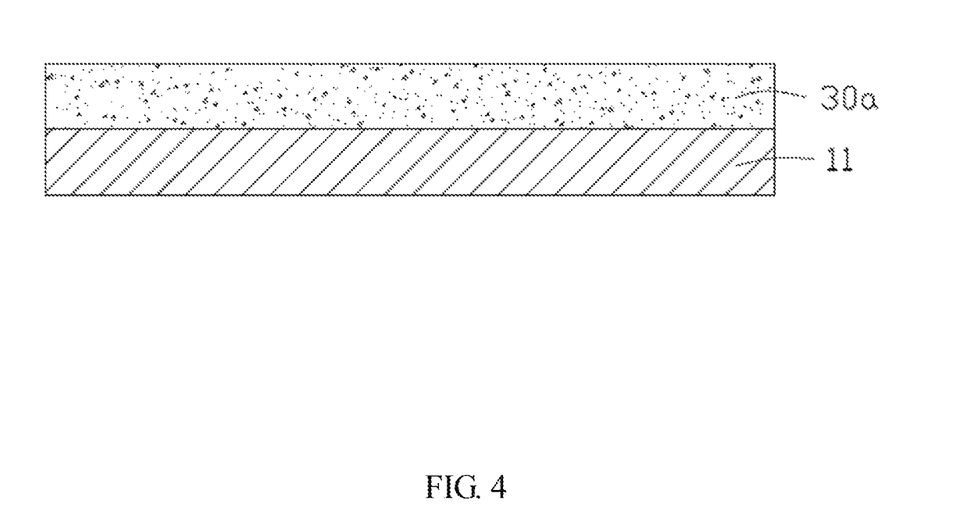
FIG. 4 is a cross-sectional view showing a resin composition coated on a surface of the first substrate of FIG. 3.

At block 402, referring to FIG. 4, a resin composition 30a is coated on a surface of the first substrate 11.

The resin composition 30a comprises a styrene-butadiene-styrene block copolymer of about 35 to about 85 parts by weight, a styrene-ethylene-butene-styrene block copolymer of about 5 to about 65 parts by weight, a polyphenylene ether of about 3 to about 35 parts by weight, and a dendritic acrylate oligomer of about 3 to about 45 parts by weight.

The resin composition 30a may further comprise a heat-conducting powder of about 5 to about 150 parts by weight.

The heat-conducting powder can be selected from a group consisting of silicon dioxide, aluminum trioxide, boron nitride, aluminum nitride, and any combination thereof.

The resin composition 30a may further comprise a flame retardant of about 5 to about 250 parts by weight. The flame retardant may be a phosphate compound. In at least one embodiment, the flame retardant may be selected from a group consisting of bisphenol diphenyl phosphate, ammonium polyphosphate, hydroquinone bis-(diphenyl phosphate), trimethyl phosphate (TMP), dimethyl methyl phosphonate (DMMP), resoreinol dixylenylphosphate (RDXP), melamine polyphosphate, accidentally phosphorus compounds, phosphazene compound, 9,10-dihydro-9-oxa-10-phosphaphenanthrene-10-oxide (DOPO), and any combination thereof, such as a flame retardant under the trade name "OP935" produced by CLAMANT Corporation.

The resin composition 30a may further comprise an ion trapping agent of about 0.5 to about 10 parts by weight. The ion trapping agent may be selected from a group consisting of aluminum silicate, hydrated metal oxide, polyvalent metal salt, and heteropoly acid. The hydrated metal oxide may be selected from a group consisting of antimony oxide hydrate ($Sb_2O_5.2H_2O$), bismuth oxide hydrate ($Bi_2O_3.nH_2O$), and any combination thereof, such as an ion trapping agent under the trade name "IEX-600" produced by TOAGOSEI CO., LTD. The polyvalent metal salt may be selected from a group consisting of zirconium hydrogen phosphate monohydrate ($Zr(HPO_4)_2.H_2O$), titanium hydrogen phosphate monohydrate ($Ti(HPO_4)_2.H_2O$), and any combination thereof. The heteropoly acid may be selected from a group consisting of molybdenum ammonia phosphate hydrate (($NH_4)_3Mo_{12}(PO_4)_{40}.nH_2O$), hydroxyapatite ($Ca_{10}(PO_4)_6(OH)_2$), aluminum magnesium carbonate hydroxide hydrate ($AlMg(OH)_3CO_3.nH_2O$), and any combination thereof.

Figure 5:
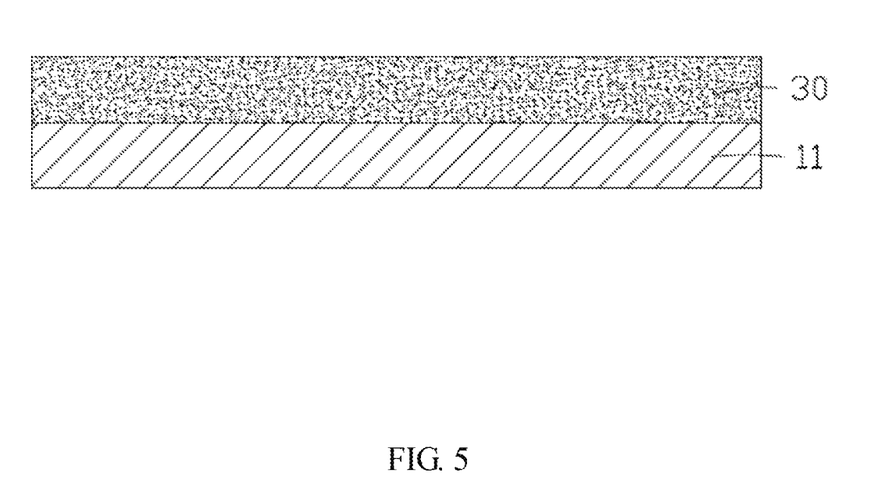
FIG. 5 is a cross-sectional view showing an adhesive layer formed by curing the the resin composition of FIG. 4.

At block 403, referring to FIG. 5, the resin composition 30a is cured to form an adhesive layer 30. In at least one embodiment, the resin composition 30a is cured at about 80 degrees Celsius to about 130 degrees Celsius for about 10 min to about 30 min.

Figure 6:
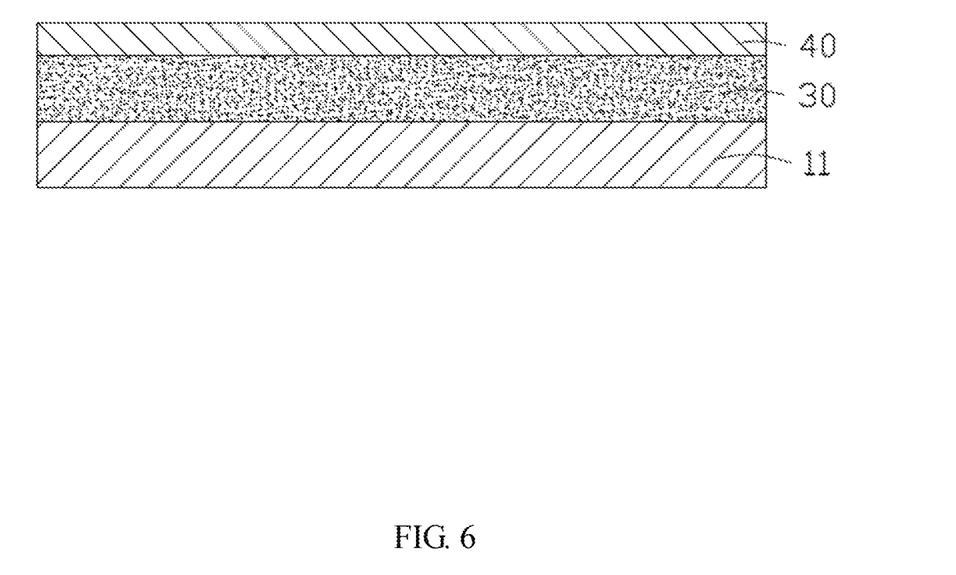
FIG. 6 is a cross-sectional view showing a release film formed on a surface of the adhesive layer facing away from the first substrate of FIG. 5.

At block 404, referring to FIG. 6, a release film 10 is formed on a surface of the adhesive layer 30 facing away from the first substrate 11.

Figure 7:
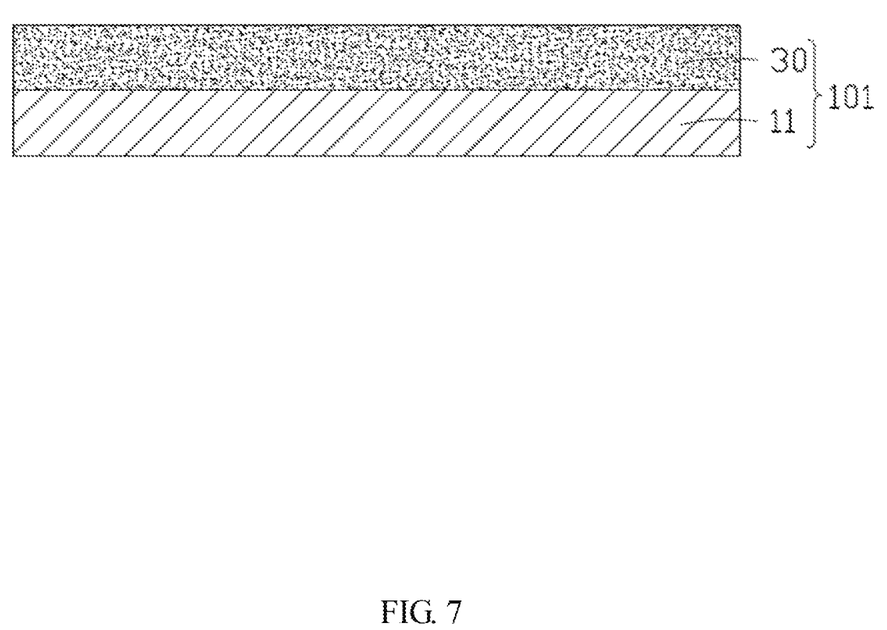
FIG. 7 is a cross-sectional view showing the release film of FIG. 6 removed.

At block 405, referring to FIG. 7, the release film 10 is removed from the adhesive layer 30.

Figure 8:
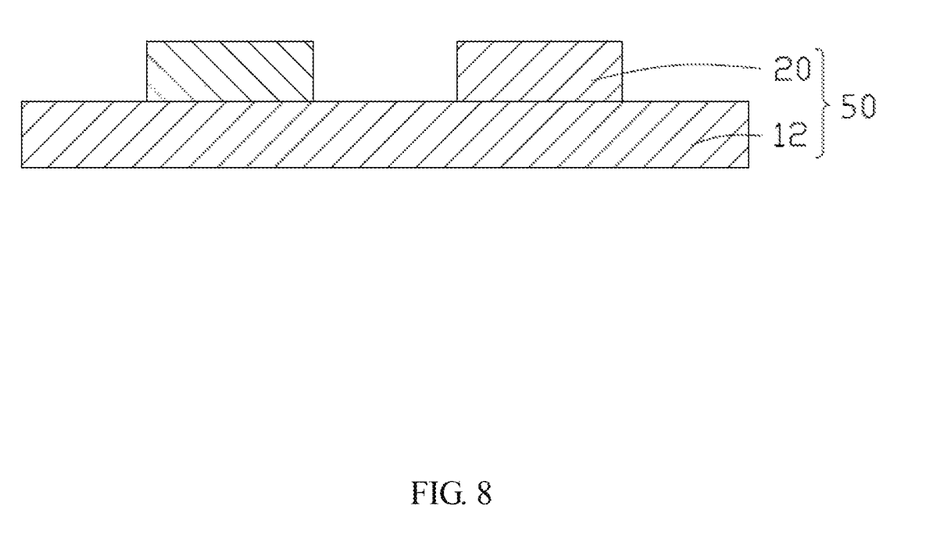
FIG. 8 is a cross-sectional view showing a base comprising a second substrate pressed on the surface of the adhesive layer facing away from the first substrate of FIG. 7.

At block 406, referring to FIG. 8, a base 50 comprising a second substrate 12 is provided, and the second substrate 12 is pressed to the surface of the adhesive layer 30 facing away from the first substrate 11. The base 50 may further comprise at least one electronic element 20 formed on a surface of the second substrate 12. The electronic element 20 is covered by the adhesive layer 30.

In another embodiment, the block 404 and the block 405 can be omitted. In another embodiment, the block 406 can be further omitted.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

When heating the resin composition 30a, the vinyl groups of the styrene-butadiene-styrene block copolymer, the vinyl groups of the styrene-ethylene-butene-styrene block copolymer will react with the dendritic acrylate oligomer to form a chemical cross-linking network structure, thereby improving cross-linking density of the adhesive layer 30. To ensure the heat resistance for the connection between the adhesive layer 30, the substrate 10 (11, 12), and the electrical conductor 20, heat can be diffused more evenly between the adhesive layer 30 and the substrate 10. By dispersing the heat-conducting powder in the adhesive layer 30, the thermal conductivity of the adhesive layer 30 is improved, and a heat can be more evenly diffused through the adhesive layer 30.

In another embodiment, the adhesive layer 30 can be applied to another electronic component, such as a circuit board.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A resin composition comprising:
   a styrene-butadiene-styrene block copolymer in 35 to 85 parts by weight;
   a styrene-ethylene-butene-styrene block copolymer in 5 to 65 parts by weight;
   a heat-conducting powder in 5 to 150 parts by weight;
   a polyphenylene ether in 3 to 35 parts by weight; and
   a dendritic acrylate oligomer in 3 to 45 parts by weight;
   wherein the heat-conducting powder is selected from a group consisting of aluminum trioxide, boron nitride, aluminum nitride, and any combination thereof.

2. The resin composition of claim 1, wherein the resin composition further comprises flame retardant in 5 to 250 parts by weight.

3. The resin composition of claim 1, wherein the resin composition further comprises an ion trapping agent in 0.5 to 10 parts by weight.

4. An adhesive layer formed by curing a resin composition, the resin composition comprising:
   a styrene-butadiene-styrene block copolymer in 35 to 85 parts by weight;
   a styrene-ethylene-butene-styrene block copolymer in 5 to 65 parts by weight;
   a heat-conducting powder in 5 to 150 parts by weight;
   a polyphenylene ether in 3 to 35 parts by weight; and
   a dendritic acrylate oligomer in 3 to 45 parts by weight;
   wherein the heat-conducting powder is selected from a group consisting of aluminum trioxide, boron nitride, aluminum nitride, and any combination thereof.

5. The adhesive layer of claim 4, wherein the resin composition further comprises a flame retardant in 5 to 250 parts by weight.

6. The adhesive layer of claim 4, wherein the resin composition further comprises an ion trapping agent in 0.5 to 10 parts by weight.

7. A circuit board comprising at least one adhesive layer, each adhesive layer formed by curing a resin composition, the resin composition comprising:
   a styrene-butadiene-styrene block copolymer in 35 to 85 parts by weight;
   a styrene-ethylene-butene-styrene block copolymer in 5 to 65 parts by weight;
   a heat-conducting powder in 5 to 150 parts by weight;
   a polyphenylene ether in 3 to 35 parts by weight; and
   a dendritic acrylate oligomer in 3 to 45 parts by weight;
   wherein the heat-conducting powder is selected from a group consisting of aluminum trioxide, boron nitride, aluminum nitride, and any combination thereof.

8. The circuit board of claim 7, wherein the resin composition further comprises a flame retardant in 5 to 250 parts by weight.

9. The circuit board of claim 7, wherein the resin composition further comprises an ion trapping agent in 0.5 to 10 parts by weight.

10. The circuit board of claim 7, wherein the circuit board further comprises a first substrate and a second substrate, the second substrate is spaced from the first substrate, the adhesive layer is sandwiched between the first substrate and the second substrate.

11. The circuit board of claim 10, wherein the circuit board further comprises at least one electrical conductor formed on a surface of the second substrate covered by the adhesive layer.

* * * * *